(12) United States Patent
Pinkerton et al.

(10) Patent No.: US 7,095,645 B2
(45) Date of Patent: Aug. 22, 2006

(54) NANOELECTROMECHANICAL MEMORY CELLS AND DATA STORAGE DEVICES

(75) Inventors: Joseph F. Pinkerton, Austin, TX (US); Jeffrey D. Mullen, Scarsdale, NY (US)

(73) Assignee: Ambient Systems, Inc., Austin, TX (US)

( * ) Notice: Subject to any disclaimer, the term of this patent is extended or adjusted under 35 U.S.C. 154(b) by 0 days.

(21) Appl. No.: 10/453,199

(22) Filed: Jun. 2, 2003

(65) Prior Publication Data

US 2004/0240252 A1 Dec. 2, 2004

(51) Int. Cl.
*G11C 11/21* (2006.01)
*G11C 11/50* (2006.01)
*G11C 16/26* (2006.01)

(52) U.S. Cl. .................. 365/151; 365/164; 365/166; 365/185.21; 977/DIG. 1

(58) Field of Classification Search .............. 365/151, 365/164, 166, 185.21; 977/DIG. 1; 257/415
See application file for complete search history.

(56) References Cited

U.S. PATENT DOCUMENTS

| 2,979,551 A | 4/1961 | Pack |
| 3,181,365 A | 5/1965 | Maninger |

(Continued)

FOREIGN PATENT DOCUMENTS

| DE | 101 28 876 A | 11/2002 |
| EP | 0518283 | 12/1992 |
| EP | 0977345 | 2/2000 |
| JP | 02004516 | 1/1990 |
| WO | WO 01/03208 | 1/2001 |
| WO | WO 0120760 | 3/2001 |
| WO | WO 0193343 | 12/2001 |
| WO | WO 02/080360 | 10/2002 |
| WO | WO 03/001657 | 1/2003 |
| WO | WO 03/021613 A | 3/2003 |
| WO | WO 03/078305 | 9/2003 |

OTHER PUBLICATIONS

Rueckes et al., "Carbon nanotube–based nonvolatile random access memory for molecular computing," Science, vol. 289 (Jul. 7, 2000) pp. 94–97.*
Halg, Beat, "On a micro–electro–mechanical nonvolatile memory cell," IEEE Trans. Electron Devices, vol. 37, No. 10 (Oct. 1990) pp. 2230–2236.*

(Continued)

*Primary Examiner*—Anh Phung
*Assistant Examiner*—J. H. Hur
(74) *Attorney, Agent, or Firm*—Fish & Neave IP Group of Ropes & Gray LLP; Robert W. Morris; Jeffrey D. Mullen

(57) ABSTRACT

Nanoelectromechanical (NEM) memory cells are provided by anchoring a conductive nanometer-scale beam (e.g., a nanotube) to a base and allowing a portion of the beam to move. A charge containment layer is provided in the vicinity of this free-moving portion. To read if a charge is stored in the charge containment layer, a charge is formed on the beam. If a charge is stored then forces between the charged beam and the charge containment layer will displace the free-moving portion of the beam. This movement may be sensed by a sense contact.

Alternatively, the beam may contact a sense contact at an ambient frequency when no charge is stored. Changing the amount of charge stored may change this contact rate. The contract rate may be sensed to determine the amount of stored charge.

46 Claims, 10 Drawing Sheets

U.S. PATENT DOCUMENTS

| | | | |
|---|---|---|---|
| 3,252,013 A | | 5/1966 | Stanton |
| 3,365,653 A | | 1/1968 | Gabor et al. |
| 3,495,101 A | | 2/1970 | Slonneger |
| 3,500,451 A | | 3/1970 | Stephen |
| 3,508,089 A | | 4/1970 | Cheshire |
| 3,609,593 A | | 9/1971 | Boll et al. |
| 4,152,537 A | | 5/1979 | Hansch |
| 4,387,318 A | | 6/1983 | Kolm et al. |
| 4,536,674 A | | 8/1985 | Schmidt |
| 4,595,864 A | | 6/1986 | Stiefelmeyer et al. |
| 4,814,657 A | | 3/1989 | Yano et al. |
| 4,966,649 A | | 10/1990 | Harada et al. |
| 5,065,085 A | | 11/1991 | Aspden et al. |
| 5,619,061 A | * | 4/1997 | Goldsmith et al. ......... 257/528 |
| 5,621,258 A | | 4/1997 | Stevenson |
| 5,649,454 A | | 7/1997 | Midha et al. |
| 5,768,192 A | | 6/1998 | Eitan |
| 5,780,727 A | | 7/1998 | Gimzewski et al. |
| 5,964,242 A | | 10/1999 | Slocum |
| 6,011,725 A | | 1/2000 | Eitan |
| 6,054,745 A | * | 4/2000 | Nakos et al. ................ 257/415 |
| 6,069,540 A | * | 5/2000 | Berenz et al. ............... 333/101 |
| 6,073,484 A | | 6/2000 | Miller et al. |
| 6,114,620 A | | 9/2000 | Zuppero et al. |
| 6,123,819 A | | 9/2000 | Peeters |
| 6,127,744 A | * | 10/2000 | Streeter et al. ............. 307/125 |
| 6,127,765 A | | 10/2000 | Fushinobu |
| 6,157,042 A | | 12/2000 | Dodd |
| 6,160,230 A | * | 12/2000 | McMillan et al. .......... 200/181 |
| 6,256,767 B1 | | 7/2001 | Kuekes et al. |
| 6,261,469 B1 | | 7/2001 | Zakhidov et al. |
| 6,300,756 B1 | | 10/2001 | Sturm et al. |
| 6,327,909 B1 | | 12/2001 | Hung et al. |
| 6,424,079 B1 | | 7/2002 | Carroll |
| 6,433,543 B1 | | 8/2002 | Shahinpoor et al. |
| 6,445,006 B1 | | 9/2002 | Brandes et al. |
| 6,445,109 B1 | | 9/2002 | Per.cedilla.in et al. |
| 6,509,605 B1 | * | 1/2003 | Smith ......................... 257/316 |
| 6,515,339 B1 | | 2/2003 | Shin et al. |
| 6,528,785 B1 | | 3/2003 | Nakayama et al. |
| 6,548,841 B1 | | 4/2003 | Frazier et al. |
| 6,559,550 B1 | | 5/2003 | Herman |
| 6,574,130 B1 | | 6/2003 | Segal et al. |
| 6,593,666 B1 | | 7/2003 | Pinkerton |
| 6,593,731 B1 | | 7/2003 | Roukes et al. |
| 6,611,033 B1 | * | 8/2003 | Hsu et al. ................... 257/414 |
| 6,643,165 B1 | | 11/2003 | Segal et al. |
| 6,653,547 B1 | | 11/2003 | Akamatsu |
| 6,669,256 B1 | * | 12/2003 | Nakayama et al. ........ 294/99.1 |
| 6,672,925 B1 | | 1/2004 | Talin et al. |
| 6,674,932 B1 | | 1/2004 | Zhang et al. |
| 6,685,810 B1 | | 2/2004 | Noca et al. |
| 6,708,491 B1 | | 3/2004 | Weaver et al. |
| 6,730,370 B1 | | 5/2004 | Olafsson |
| 6,756,795 B1 | | 6/2004 | Hunt et al. |
| 6,762,116 B1 | | 7/2004 | Skidmore |
| 6,774,533 B1 | | 8/2004 | Fujita et al. |
| 6,803,840 B1 | | 10/2004 | Hunt et al. |
| 6,805,390 B1 | | 10/2004 | Nakayama et al. |
| 6,806,624 B1 | | 10/2004 | Lee et al. |
| 6,828,800 B1 | | 12/2004 | Reich et al. |
| 6,846,682 B1 | | 1/2005 | Health et al. |
| 6,882,051 B1 | | 4/2005 | Majumdar et al. |
| 6,911,682 B1 | | 6/2005 | Rueckes et al. |
| 6,914,329 B1 | | 7/2005 | Lee et al. |
| 6,953,977 B1 | | 10/2005 | Mlcak et al. |
| 2002/0024099 A1 | | 2/2002 | Carroll |
| 2002/0039620 A1 | | 4/2002 | Shahlnpoor et al. |
| 2002/0043895 A1 | | 4/2002 | Richards et al. |
| 2002/0167374 A1 | | 11/2002 | Hunt et al. |
| 2002/0175408 A1 | | 11/2002 | Majumdar et al. |
| 2002/0180306 A1 | | 12/2002 | Hunt et al. |
| 2003/0033876 A1 | | 2/2003 | Roukes et al. |
| 2003/0036332 A1 | | 2/2003 | Talin |
| 2003/0172726 A1 | | 9/2003 | Yasutake et al. |
| 2003/0175161 A1 | * | 9/2003 | Gabriel et al. ................ 422/90 |
| 2004/0012062 A1 | | 1/2004 | Miyajima et al. |
| 2004/0157304 A1 | | 8/2004 | Guo |
| 2004/0239210 A1 | | 12/2004 | Pinkerton et al. |
| 2004/0240252 A1 | | 12/2004 | Pinkerton et al. |
| 2005/0037547 A1 | | 2/2005 | Bertin et al. |
| 2005/0104085 A1 | | 5/2005 | Pinkerton et al. |
| 2005/0179339 A1 | | 8/2005 | Pinkerton et al. |

OTHER PUBLICATIONS

Halliday et al.; "Physics. Third Edition"; John Wiley & Sons, Inc.; 1978; pp. 529–531.

Dresselhaus et al.; "Carbon Nanotubes: Synthesis, Structure, Properties, and Applications"; Springer–Verlag Berlin Heidelberg 2001; pp. 198–199, 292–293.

Kinaret J.M. et al. "A Carbon–Nanotube–Based Nanorelay", Applied Physics Letters, American Institute of Physics, New York, USA, vol. 8, No. 8, pp. 1287–1289, Feb. 24, 2003.

U.S. Appl. No. 60/453,371, filed Feb. 23, 2004, Mullen.

U.S. Appl. No. 10/785,289, filed Feb. 23, 2004, Mullen.

Database Inspec Online!, Institute of Electrical Engineers, Stevenage, GB; Ponomarenko et al. "Properties of boron carbon nanotubes: density–functional–based tight–binding calculations," Database accession No. 7588110, XP002278946, abstract Physical Review B (Condensed Matter and Material Physics), vol. 67, No. 12, pp. 125401–1–5, Mar. 15, 2003.

Sung et al. "Well–aligned carbon nitride nanotubes synthesized in anodic alumina by electron cyclotron resonance chemical vapor deposition," Applied Physics Letters, vol. 74, No. 2, pp. 197–199, Jan. 11, 1999.

U.S. Appl. No. 60/424,079, filed Feb. 21, 2003, Mullen.

Baughman et al., "Carbon Nanotube Actuators," Science, May 21, 1999, Issue 5418, vol. 284, pp. 1240–1344.

Cleland et al., "Fabrication of High Frequency Nanometer Scale Mechanical Resonators from Bulk Si Crystals," Appl. Phys. Lett., vol. 69, No. 18, pp. 2653–2655, Oct. 28, 1996.

Kinaret J M et al., "A Carbon–nanotube–based nanorelay" Applied Physics Letters, American Institiute of Physics, New York, USA, vol. 82, No. 8, Feb. 24, 2003, pp. 1287–1289.

White D R et al., "The status of Johnson Noise Thermometry," Metrologia Bur. Int. Poids & Measures, France, vol. 33, 1996, pp. 325–335.

Dequesnes M et al., "Calculation of pull–in voltages for carbon–nanotube–based nanoelectromechanical switches," nanotechnology IOP publishing UK, vol. 13, Jan. 22, 2002, pp. 120–131.

Baughman et al. "Carbon Nanotube Actuators," Science American Association for the Advancement of Science, U.S. vol. 284, May 21, 1999, pp. 1340–1344.

* cited by examiner

NANOELECTROMECHANICAL MEMORY CELLS AND DATA STORAGE DEVICES

BACKGROUND OF THE INVENTION

This invention relates to memory cells. More particularly, the present invention relates to nanometer-scale memory cells that utilize nanotubes, or other nanometer-scale filaments, as a charge sensing mechanism.

Writing and erasing a charge into a charge containment layer is well known in the art. Moreover, multiple distinct charges can now be stored in separate portions of a single containment layer. Examples of such memory cells can be found, for example, in U.S. Pat. Nos. 5,768,192 and 6,011,725. However, current systems utilize transistors to determine if a charge is stored in a containment layer.

More particularly, current systems position a charge containment layer between the channel and gate of a transistor such as a metal oxide field-effect transistor (MOSFET). If a charge is stored in this charge containment layer then the turn-ON voltage of the transistor increases. In this manner, a charge is determined as being stored by applying different turn-ON voltages and determining for which turn-ON voltage the transistor turns ON. Correlating (mapping) the turn-ON voltage to a bit (e.g., a 1 if a charge is stored or a 0 if a charge is not stored) provides the functionality of a base-two memory cell; the functionality of being able to store two information states (ON and OFF) in a memory cell.

MOSFETs are deficient because they have minimum sizing limitations that generally reside in the micrometer scale. It is therefore desirable to provide a memory cell that is sized on the nanometer-scale. It is also desirable to provide nanometer-scale memory cells that can be utilized to store several bits of information, several states of information, or store a bit of information having several states (e.g., can provide a base-three or base-four information bit). It is also desirable to provide memory cells that consume low amounts of power and can store very small levels of charge.

SUMMARY OF THE INVENTION

It is an object of the present invention to provide nanometer-scale electromechanical (NEM) memory cells. More particularly, it is an object of the present invention to provide NEM memory cells that utilize a nanometer-scale beam that is both mechanically flexible and electrically conductive, such as a nanotube, to determine if a charge is stored in a charge containment layer. Such NEM memory cells would exhibit low power consumption and have the ability to store and sense very small amounts of charge.

A nanotube is anchored to a base (either at both ends, at a single end, or between two ends) and includes a portion that is free to move. This free-moving portion is placed in the proximity of a charge containment layer. To detect if a charge of a particular polarity is stored in this charge containment layer, a READ operation is performed by applying a voltage to the nanotube. If a charge is stored in the charge containment layer then this charge will interact with the charge on the nanotube and cause the nanotube to displace. In placing sense contacts about the nanotube in positions where the nanotube would displace to if such an event occurs, the present invention can determine the polarity of a charge, the amount of a charge, or the presence of a charge in a charge containment layer.

Take for example the instance in which a charge of a particular polarity is placed in a charge containment layer. If a charge of an opposite polarity is applied to the nanotube then the nanotube will attract to the charge containment layer due to the interaction of these opposite charge polarities. Placing a sense contact between the nanotube and this charge containment layer will preferably result, if the charges are strong enough and of opposite polarities, in a closed circuit or capacitor coupling between the nanotube and the sense contact.

In one embodiment, a HIGH AC or DC signal is applied to the nanotube in order to apply a charge to that nanotube and sense if a relatively LOW charge exists in the charge containment layer. Thus, when the nanotube couples a sense contact, this voltage will be applied to the sense contact from which an output signal, in the form of either a voltage or current signal, may be utilized by memory control circuitry.

A single charge containment layer may store multiple states or bits of data. For example, a charge containment layer may store a positive charge, a negative charge, or no charge. If a charge is written into a charge containment layer that is of the same polarity as the voltage applied to the nanotube, then the free-moving portion of the nanotube may repel. A second sense contact may be included in the location where the nanotube would repel to in order to sense this stored polarity.

Furthermore, two or more separate charges may be stored in a single charge containment layer. In this manner multiple bits (not states) may be stored, read, and erased from a single charge containment layer. Reading which charge or charges are stored in such a layer may be determined by placing multiple sense contacts around the nanotube and aligning them with where the nanotube would displace if a particular charge, or group of charges, is present in the charge containment layer. Such an embodiment would allow for more than two separate charges (bits) to be read from a single charge containment layer.

Alternatively, multiple charge containment layers may be placed around the nanotube in order to store multiple bits, or states, within a single nanotube memory cell. As in yet another alternate embodiment, the amount of charge of a certain polarity may be read by a nanotube of the present invention. For example, a LARGE positive charge will attract a nanotube exhibiting a negative charge profile. A SMALL positive charge will attract the same nanotube to a lesser degree (with respect to the LARGE positive charge). Thus, sense contacts may be placed around the nanotube according to the location of where the nanotube would be displaced if a SMALL or LARGE charge is stored in a charge containment layers.

BRIEF DESCRIPTION OF THE DRAWINGS

The above and other objects and advantages of the present invention will be apparent upon consideration of the following detailed description, taken in conjunction with accompanying drawings, in which like reference characters refer to like parts throughout, and in which.

DETAILED DESCRIPTION OF THE DRAWINGS

Figure 1:
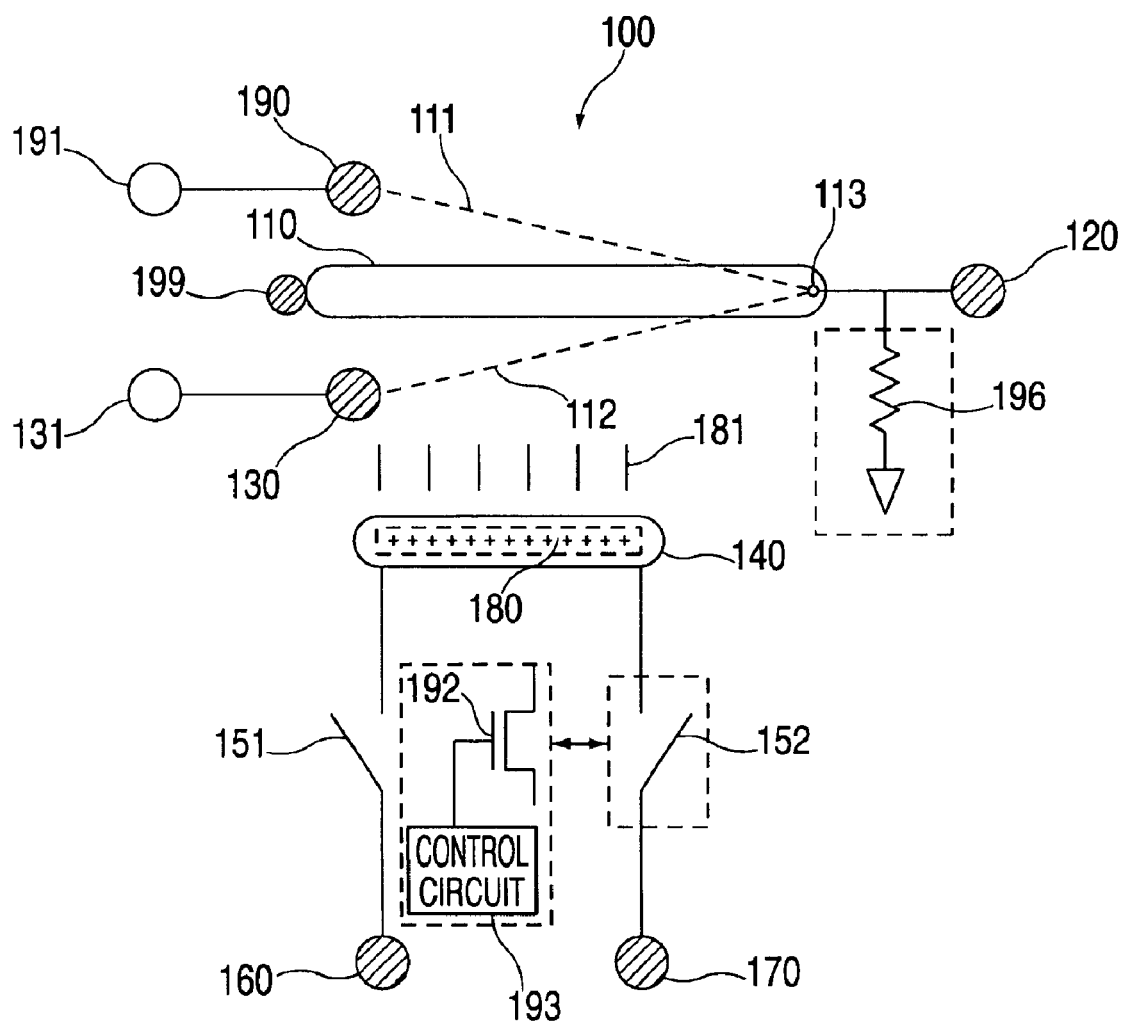
FIG. 1 is a schematic diagram of a nanometer-scale electromechanical memory cell constructed in accordance with the principles of the present invention.

Turning first to FIG. 1, NEM memory cell 100 is shown that includes a nanotube 110, anchored at point 113, and a charge containment layer 140. Nanotube 110 is supplied a voltage by contact 120 and is free to move to positions 111 and 112.

Persons skilled in the art will appreciate that nanotube 110 is more generally a nanometer-scale beam. Nanotube 110 may be any variety of mechanically flexible and electrically conductive molecules, filament, or bonded group of molecules, and still coincide with the spirit of the invention. Furthermore, anchor point 113 may be included anywhere on nanotube 110 as well as in multiple locations. For example, both ends of nanotube 110 may be anchored such that a jump-rope movement is provided by a middle, free-moving, portion of such a nanotube. As per another example, the middle portion of the nanotube may be anchored such that-both ends of the nanotube are free-to-move.

Charge containment layer 140 may be utilized to store charge profile 180 such that, preferably, electric field vectors 181 are provided. Writing charge profile 180 into and erasing charge profile 180 from charge containment layer 140 is preferably controlled by control devices 151 and 152 which, in turn, control when the voltage signals applied to contacts 160 and 170 electrically couple charge containment layer 140. Control devices 151 and 152 may be, for example, transistors (e.g., nanotube-based nanometer-scale transistors) or diodes.

In preferred embodiments, control devices 151 and 152 are isolation layers (e.g., oxide or non-conductive layers) formed between charge containment layer 140 and contacts 160 and 170, respectively. Such isolation layers are preferably configured such that particular voltages applied to contact 160 and/or 170 can overcome the isolation characteristics of the control device and store/remove a charge from charge containment layer 140. Such isolation layers are also preferably configured such that a stored charge (e.g., charge profile 180) generally does not overcome the isolation characteristics of the control device.

In this manner, charge profile 180 may generally be written/stored into charge containment layer 140 by performing a WRITE operation. Such a WRITE operation may be accomplished by applying, for example, a voltage signal of the desired polarity to charge containment layer 140. If control device 151 is utilized as an isolation layer then the voltage supplied to contact 160 is preferably large enough to overcome this isolation.

More than one control device may be utilized in a WRITE operation. For example, control device 152 may aid control device 151 in trapping charge profile 180 in charge containment layer 140. In this example, control device 151 may be utilized as a pulling force by allowing unwanted charges (e.g., charges of a polarity opposite that of a desired charge profile 180) to escape by providing a signal that attracts these unwanted charges.

Manipulating the strength and duration of the voltage or current signals supplied to contacts 160 and/or 170 may only affect the speed and accuracy of trapping charge profile 180, but may also be utilized to store charge profiles 180 that exhibit electric field vectors 181 having different and distinguishable strengths/intensities. For example, a LARGE density of positive charges in charge containment layer 180 will preferably create LARGE positive electric field 181. However, a relatively SMALL density of positive charges in charge containment layer 180 will preferably create SMALL positive electrostatic forces 181.

ERASE operations may be conducted in a manner similar to the WRITE operations described above. For example, if a non-neutral charge profile 180 exists in charge containment layer 140 then a hot-hole or electron injection procedure may be undertaken by neutralizing charge profile 180 by injecting an amount of charge having an opposite polarity. A TEST operation may also be included to determine when charge profile 180 is neutral or over-erased.

Persons skilled in the art will appreciate that multiple different types of WRITE/ERASE operations may be performed on containment layer 140 in order to store, modify, or remove charge profile 180 from charge containment layer 140. For example, if control devices 151 or 152 are transistors, then an ERASE operation may be performed by grounding-out charge profile 180 by electrically coupling a ground signal to charge containment layer 140. Such an operation is an example of an operation in which over-erasure of charge containment layer 140 will, generally, not occur. All ERASE/WRITE/TEST operations fall within the spirit of the present invention.

Charge profile 180 may be read by utilizing nanotube 110 and by performing a READ operation. Generally, a READ operation occurs as follows. A voltage (either AC or DC) is applied to nanotube 110 at contact 120 and the resultant charges that are provided in nanotube 110 may interact with a non-neutral charge profile 180.

For example, if charge profile 180 has the same polarity as the voltage, or charge generator, applied to nanotube 110 then nanotube 110 will generally repel. If nanotube 110 is repelled far enough then nanotube 110 will electrically couple (e.g., create a galvanic connection or a capacitive coupling) at sense contact 190 and an output signal 191 will be provided that is representative of the signal applied to contact 120.

Charge profile 180 may also be read by determining a contact rate, or change in contact rate, between nanotube 110 and a sense contact. For example, when charge profile 180 contains a neutral (e.g., zero) charge, nanotube 110 preferably contacts a sense contact (e.g., sense contact 190) at, or about, an ambient rate due to the thermal vibrations of the environment that memory cell 100 is located in. More particularly, nanotube 110 may oscillate according to surrounding temperatures. Thus, if charge profile 180 provides attracting electric field vectors 181 to nanotube 110 then the contact rate between nanotube 110 and the sense contact will increase. In this manner, the contact rate between nanotube 110 and a particular sense contact is proportional to the characteristics of charge profile 180.

As per another example, if it is desirable to READ if a net positive charge is stored in charge containment layer 180 then a negative voltage may be applied to nanotube 110 via contact 120. If a net-positive charge is stored in charge containment layer 140 then nanotube 110 will attract to charge containment layer 180. If charge profile 180 is of the appropriate polarity and strong enough then nanotube 110 preferably electrically couples to sense contact 130. Because a voltage is induced on nanotube 110, sense contact 130 will, if electrically coupled to nanotube 110, provide output signal 131 that is representative of the signal applied to contact 120. If an appropriate charge profile 180 is not stored in charge containment layer 180 then there is not an appropriate sense signal 131 on sense contact 130.

Thus, to-reiterate, a READ operation is generally accomplished as follows. A charge of a particular polarity is formed on nanotube 110. A sense contact is placed about nanotube 110 such that if a particular charge profile 180 is stored in charge containment layer 180 then electric field vectors 181 will interact with the electric field of nanotube 110 and displace nanotube 110 toward the sense contact. In this manner the sense contact determines, by providing an output signal, if the particular charge profile is stored in charge containment layer 140 by determining if a sense signal is obtained for a period of time that nanotube 110 is charged by signals applied to contact 120. As will be described in more detail later, output signals may also be obtained through, or about, contact 120 and sense signals may be representative of a frequency of electrical interactions between nanotube 110 and a sense contact.

Persons skilled in the art will appreciate that output signals 131 and 191 can be translated into a logical "1" or "0". For example, if a net-negative charge is impressed on nanotube 110, sense contact 130 can determine if a net-positive charge is stored in charge containment layer 140. A logical "1" or "0" may be associated to these two states such that charge containment layer 140 can store a bit of information. For example, if sense contact 130 detects a net-positive charge, a logical "1" may be registered. If sense contact 130 does not detect a net-positive charge, a logical "0" may be recognized.

Persons skilled in the art will appreciate that memory cell 100 may be configured to store multiple states and bits of information. For example, if both sense contacts 130 and 190 are included, then three states may be stored (e.g., net-positive, net-negative, and neutral charge containment layer 140). If three states are stored by NEM memory cell 100 then NEM memory cell 100 could be considered as storing a single base-three bit. Base-three tailored controllers, encoders, and multiplexers would preferably be included in such an embodiment. Embodiments which store multiple states, and are configured differently than NEM memory cell 100 to store multiple states, are described later in the description.

As mentioned above, a TEST operation may be included in NEM memory cell 100. Such a TEST operation may included utilized to check if charge profile 180 is neutral, under-erased, or over-erased. Such an operation may be beneficial, for example, after an ERASE operation or as a stage/stages during a multiple-stage ERASE operation.

Sense contact 199 may included around the resting location of nanotube 110 and utilized in one embodiment of a TEST operation. Sense contact 199 couples to nanotube 110 when charge profile 180 is neutral and nanotube 110 is in a resting location. An output signal from sense contact 199 may be provided, for example, by providing a voltage signal to contact 120.

Persons skilled in the art will appreciate that thermal vibrations around nanotube 110 may cause nanotube 110 to vibrate around a resting location. In this manner, nanotube 110 may contact a sense contact of memory cell 100 even when charge profile 180 does not provide any electrostatic force vectors 181. Thus, nanotube 110 may not continuously contact sense contact 199 but contact sense contact 199 at a particular frequency, or in a range of particular frequencies, when no charge is contained in charge profile 180.

If a TEST operation is executed after an ERASE operation and the TEST operation fails (e.g., sense contact 199 does not sense a signal representative of the signal applied to nanotube 110) then a READ operation may be utilized to determine the polarity of charge containment layer 140. According to the results of this READ operation, an appropriate ERASE operation may be performed followed by yet another TEST operation. This routine may continue until the TEST operation succeeds.

Persons skilled in the art will appreciate that sense contact 199 is not needed in order to perform a TEST operation. Alternatively, relatively very LARGE signals may be applied to contact 120 to sense even very SMALL charge profiles 180 in charge containment layer 140. In this manner, the strength of the signal applied to contact 120 that is needed to couple nanotube 110 with a sense contact is representative of the amount of charge stored in charge containment layer 140.

Persons skilled in the art will appreciate that in some embodiments a TEST operation may not be needed, or may not be desired because it will not be possible to over-erase charge containment layer 140 (or any over-erasure of charge containment layer 140 is negligible even if over-erasure occurs, for example, thousands of times).

Control circuitry 193 may be utilized to perform various READ, WRITE, and ERASE operations to multiple memory cells 100. Operations on memory cells of the present invention may be executed on batches of memory cells (e.g., array sectors) or single memory cells. Encoders/decoders and Multiplexers/dividers (not shown) may also be included to help route, manipulate, select, and control the signals of one or more memory cells 100.

Thermal characteristics of the environment about NEM memory cell 100 may cause nanotube 110 to vibrate about anchor point 113. If these thermal vibrations are strong enough, or the sense contacts are close enough to nanotube 110, then nanotube 110 may couple with sense contacts 130 at, or in a range associated with, an ambient frequency. For example, regardless of the strength and polarity of charge profile 180, nanotube may couple with contact 130, for example, 100 times a second if no charge is imposed on nanotube 110. However, if charge profile 180 is non-neutral and nanotube 110 is supplied with a charge profile having an opposite polarity to charge profile 180 then the number of contacts between nanotube 110 and contact 130 will increase to, for example, 1000 times a second. In this manner, the strength and polarity of charge profile 140 may be determined not only by the location in which nanotube 110 is displaced, but the number of times (frequency) that nanotube 110 contacts (or capacitively couples) a sense contact during a period of time. Furthering this example, a SMALL charge profile 180 may be distinguished from a LARGE charge profile 180 because a LARGE charge profile 180 will preferably contact sense contact 130 at a different frequency then if a SMALL charge profile 180 is stored.

Persons skilled in the art will appreciate that other structures and electrical characteristics may be included, and advantageously utilized, in NEM memory cell 100. For example, a magnetic field (not shown) may be included in memory cell 100 such that a Lorentz force is created when nanotube 110 is electrically coupled to a sense contact and current flows through nanotube 110. Nanotube 110 may be tube-shaped (e.g., hollow) or rod-shaped (e.g., solid).

Alternatively, memory cell 100 can be configured such that current flows from sense contact 130 to contact 120 via nanotube 110. Moreover, contact 120 may be utilized as a sense contact. For example, if resistor 196 is included then no current will flow through resistor 196 when nanotube 110 is not electrically coupled to sense contact 130 (open circuit conditions). However, an amount of current will preferably flow through resistor 196 when nanotube 110 couples contact 130 and current flows through nanotube 110 (closed circuit conditions). Thus, a sense signal may be obtained from sense contact 120 by way of, for example, resistor 196.

As stated above, control device 152 may be a transistor. More particularly, control device 152 may be transistor 192. Transistor 192 may be configured to have, for example, a collector terminal (or source terminal) coupled to charge containment layer 140 and an emitter terminal (or drain terminal) coupled to a control contact such as contact 170. Persons skilled in the art will appreciate that the emitter terminal of transistor 192 may alternatively be coupled to charge containment layer 140 and the collector terminal of transistor 192 may be coupled to a control contact. Furthermore, the base of transistor 192 may be coupled to control circuitry 193. In such an embodiment, the control contact may be coupled to, for example, a voltage source or a ground terminal such that control circuitry 193 controls when this voltage source, or ground terminal, is coupled to charge containment layer 140.

Figure 2:
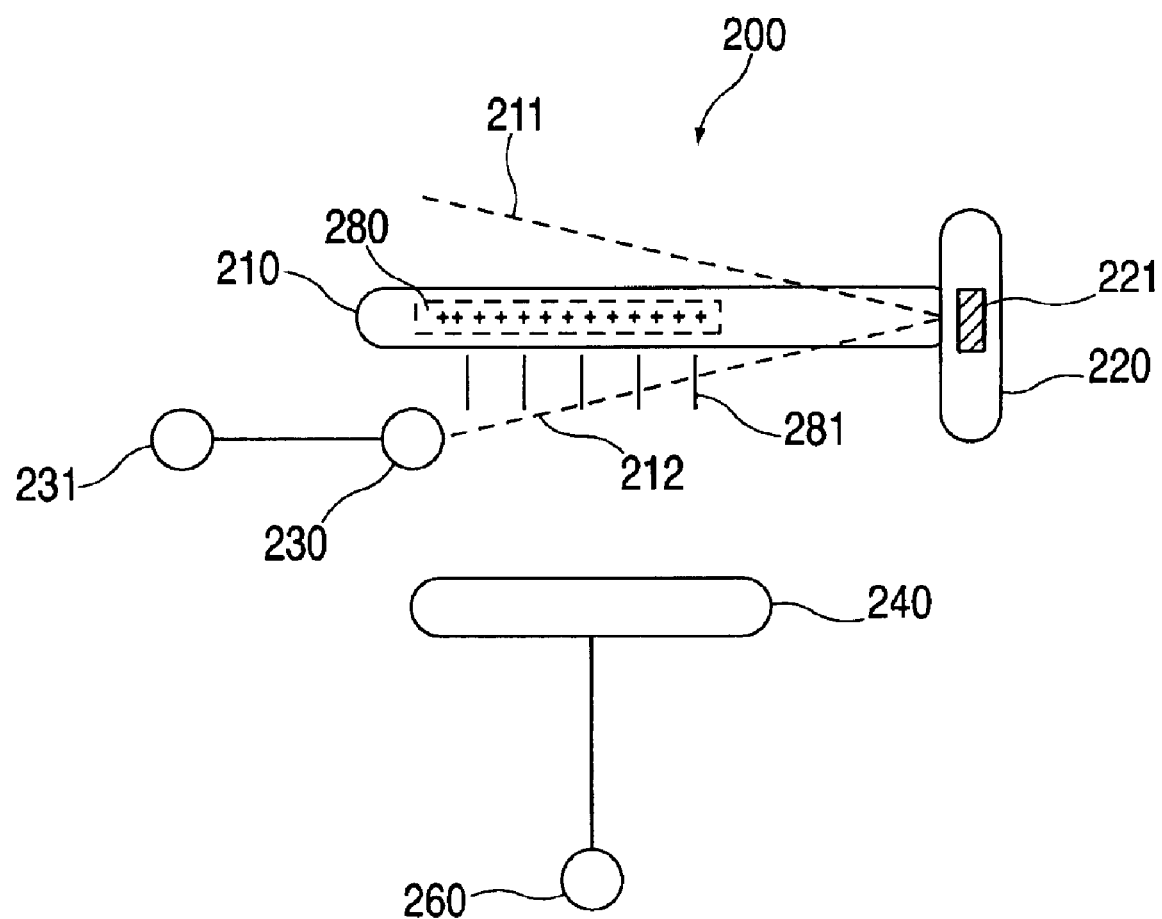
FIG. 2 is a schematic diagram of another nanometer-scale electromechanical memory cell constructed in accordance with the principles of the present invention.

FIG. 2 shows memory cell 200 in which nanotube 210 is utilized as a charge containment device. Nanotube 210 is preferably filled, either substantially or partially, with a charge containment layer or filaments of a charge containment layer. Nanotube 210 is isolated by isolation layer 220, to which nanotube 210 is also preferably anchored. Operations on nanotube 210 may be executed by signals 231 applied to contact 230 and signals applied to contact 221. Charge member layer 240 may also be included and have a charge profile provided by contact 260. Similar to NEM memory cell 100, a control device may be included between contact 260 and containment layer 240.

Memory cell 200 generally operates as follows. A voltage signal is supplied to charge member layer 240 by contact 260 such that if an opposite polarity of charge exists in nanotube 210 then nanotube 210 will electrically couple contact 230 and sense signal 231 will be obtained from contact 230 that is representative of charge profile 280. Persons skilled in the art will appreciate that elements of, for example, NEM memory cell of FIG. 100 may be included in NEM memory cell 200. For example, a second sense contact may be included above nanotube 210 to sense a repelling force created when charge profile 280 has the same polarity as charge member layer 240. In one WRITE operation, a charge or hole may be injected into nanotube 210 by contact 221. A more detailed description of the operation of memory cell 200 is discussed in accordance with NEM memory cell 400 of FIG. 4.

Figure 3:
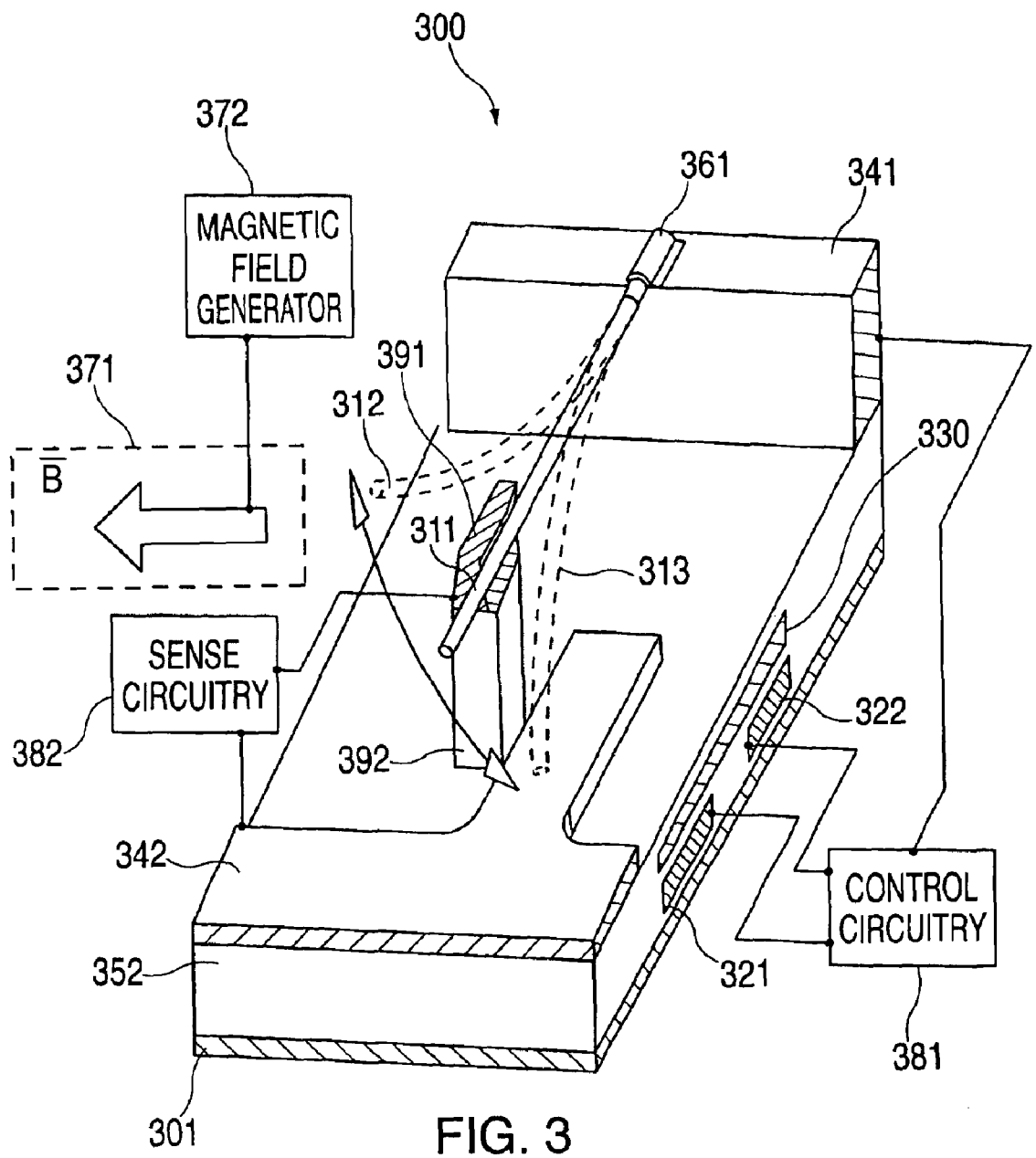
FIG. 3 is a three-dimensional perspective view of one embodiment of the nanometer-scale electromechanical memory cell from FIG. 1 constructed in accordance with the principles of the present invention.

FIG. 3 shows NEM memory cell 300 which is one embodiment constructed from the principles of NEM memory cell 100 of FIG. 1. Nanotube 311 is anchored to base 301 and is free to move between positions 312 and 313. In particular, nanotube 311 is anchored to contact 341 via retaining member 361. Contact 341 is then anchored to base 301 via isolation layer 352.

As in NEM memory cell 100 of FIG. 1, a charge containment layer, charge containment layer 330, is included in NEM memory cell 300. Contacts 321 and 322 may be utilized to perform WRITE and ERASE operations. Persons skilled in the art will appreciate that control devices 151 and 152 of FIG. 1 are included in NEM memory cell 300 as the portions of isolation 352 between charge containment layer 330 and contacts 321 and 322, respectively.

Generally, if a charge is stored in charge containment layer 330 that has an opposite polarity then the charge induced on nanotube 311, and if the charges are sufficiently strong, then nanotube 311 may electrically couple to sense contact 342. Magnetic field 371 may be applied, or selectively applied, to memory cell 300 such that if current flows through nanotube 311 then nanotube 311 will stay coupled to sense contact 342 because of the Lorentz forces created by magnetic field 371.

Persons skilled in the art will appreciate that in one embodiment, magnetic field 371 may be selectively turned ON when a READ operation is performed. As a result of selectively turning ON magnetic field 371 and the voltage source applied to contact 341, power consumption may be reduced.

Similarly, a voltage signal may be applied to contact 341 only when a READ operation is performed because, when it is not desirable to READ charge containment layer 330, applying a signal to layer 341 may not provide any functionality. However, persons skilled in the art will appreciate that the opposite may be true. For example, if control circuitry is trying to read a memory cell in a sector in which memory cell 300 is located then all the memory cells of this location may be provided a signal to layer 341, but only the sense contact for the desired memory cell will be read. Doing so would decrease the amount of circuit complexity that may be included to provide signals to layer 341.

To employ the TEST operation described above, contact 391 may be placed about the resting location of nanotube 311 and anchored by non-conductive layer 392. Contact 391 may also be placed, for example, above nanotube 311 and on the resting location of nanotube 311 so nanotube 311 usually couples with contact 391 when nanotube 311 is in a resting position (the position nanotube 311 is shown as being in for FIG. 3). In this manner, contact 391 preferably forms a portion of a ceiling (not shown) such that nanotube 311 does not touch contact 391 and isolation layer 392 as nanotube 311 descends towards sense contact 342. Thus, wear to memory cell 300 is reduced.

To reiterate, any number of sense contacts (e.g., sense contacts 342) may be placed anywhere about charge containment layer 330 and configured to provide functionality in accordance with the principles of the present invention. Furthermore, one or more contacts (e.g., contacts 321 and 322) may also be utilized to perform the operations on memory cell 300 and may be placed in a variety of locations around one or more charge containment layers (e.g., charge containment layer 330). Such configurations are within the spirit of the present invention. Additional embodiments further illustrating these principles are discussed below in more detail.

Persons skilled in the art will appreciate that memory cell 300 can be READ numerous times without having to be RE-WRITTEN after each READ operation. This is an advantage over numerous conventional micrometer-scale memory cells that require a charge to be RE-WRITTEN into a charge containment layer if the charge containment layer is READ and determined to have contained a charge. This is because such memory cells remove a charge from a charge containment layer in order to read that charge.

Sense circuitry 382 and control circuitry 381 may also be included in NEM memory cell 300. Sense circuitry 382 may be, for example, coupled to contact 342 to sense the electrical signals provided from control circuitry 381 to contact 341 when nanotube 311 is electrically coupled to contact 342. Sense circuitry 382 may also be, for example, coupled to contact 391 in order to sense when nanotube 311 is electrically coupled to contact 391 (e.g., when the electrical signals provided to contact 341 flow through nanotube 311 to contact 391 or vise versa). Control circuitry 381 may be coupled, for example, to WRITE/ERASE contacts 321 and 322 in order to provide appropriate electrical signals to charge containment layer 330. Persons skilled in the art will appreciate that sense circuitry 382 and control circuitry 381 may be coupled to other components of NEM memory cell 300. For example, control circuitry 381 may be coupled to contact 342 and sense circuitry 382 may be coupled to contact 341. Additionally, magnetic field 371 is preferably provided by magnetic field generator 372.

Persons skilled in the art will appreciate that nanotube 311 is generally fixed to base 301 by a mounting member. Such a mounting member may include, for example, any number of components that are placed between nanotube 311 and base member 301. For example, nanotube 311 may be mounted to base 301 by contact 341 or by both contact 341 and isolation layer 352. Preferably, nanotube 311 is fixed to base 301 by mounting components such that a portion of nanotube 311 does not move with respect to base 301. Furthermore, these mounting components also preferably provide at least one other portion of nanotube 311 that is free to move with respect to base 301.

Figure 4:
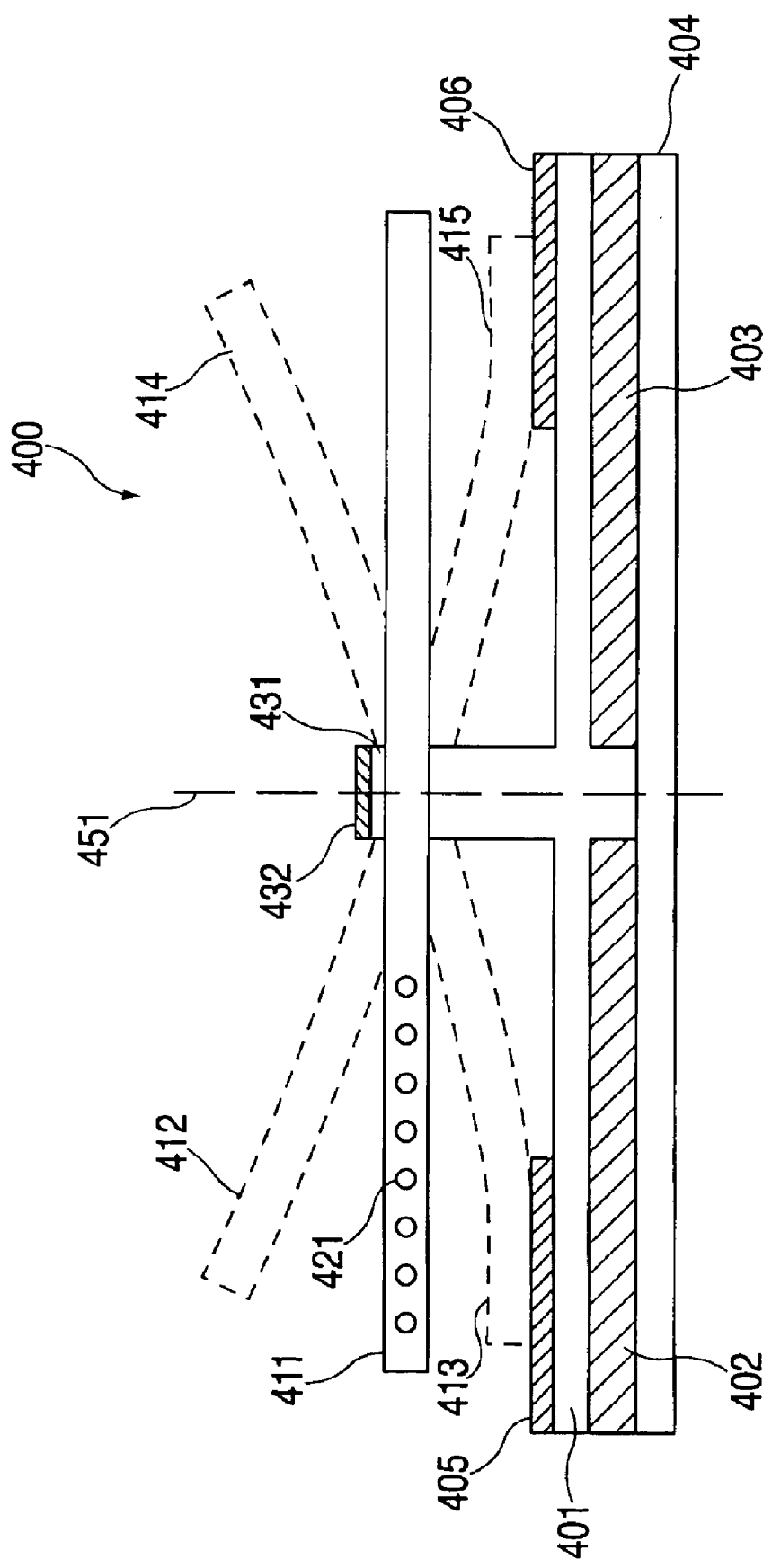
FIG. 4 is a three-dimensional perspective view of one embodiment of the nanometer-scale electromechanical memory cell of FIG. 2 constructed in accordance with the principles of the present invention.

FIG. 4 shows NEM memory cell 400 which includes nanotube 411. In the preferred embodiment, the middle of nanotube 411 is attached to base member 404 such that the ends of nanotube 411 are free to move. Nanotube 411 may be stabilized at its center by, for example, isolation layers 431 or 401.

Nanotube 411 may be fabricated to contain molecules 421. Molecules 421 may exhibit charge containment characteristics. For example, molecules 421 may be nitride-oxide or dielectric molecules. As a result of molecules 421 being located inside of nanotube 411, a charge that is deposited into nanotube 411 may be captured. As a result, a nanotube-based memory cell may be constructed in accordance with the principles of the present invention.

In NEM Memory cell 400, a WRITE operation may occur as follows. Nanotube 411 is manipulated by charge members 402 and 403 into either position 413 or 415 to create electrical connections with either contact layers 405 or 406, respectively. If, for example, nanotube 411 is attracted to charge member 402 such that nanotube 411 electrically couples with contact 405 then molecules 421 may become charged with the signal applied to contact 405 at that time. As per an alternative, nanotube 411 may be charged by placing a large voltage signal on contact layer 432 such that the signal seeps through isolation layer 431.

In NEM memory cell 400, a READ operation may occur as follows. An "attracting" charge (e.g., charge opposite the charge placed in nanotube 411 during a WRITE operation) may be placed on charge member layer 402 (and/or charge member 403). Contacts 405 and 406 may then be used to sense when nanotube 411 comes into contact with contacts 405 and 405. If zero or a LOW charge (e.g., logical 0) is present in nanotube 411 than the amount of charge placed on charge members 402 and 403 will be relatively large when creating an electrical connection with contacts 405 and 406. If a HIGH charge (e.g., logical 1) is present in nanotube 400, than the amount of charge placed on charge members 402 and 402 will be relatively small when creating an electrical connection with contacts 405 and 406. Thus, as per this example, NEM memory cell 400 may be read by measuring the amount of charge needed on charge members 402 and 403 to create an electrical connection between nanotube 411 and electrical contacts 405 and 406.

Persons skilled in the art will appreciate that specific amounts of charge may be stored and distinguished from each other in nanotube 411. In this example, the amount of charge required to be applied to charge members 402 and 403 to sense nanotube 411 by contacts 405 and 406 may be utilized in determining the amount of charge stored in nanotube 411. As a result, multiple states may be stored and distinguished as nanotube 411 holds multiple charge profiles (e.g., 4 measurable states allows nanotube 411 to store 2 bits). Persons skilled in the art will appreciate that the READ operation described above may result in a discharging of the charge stored in nanotube 411. However, by including two free-moving ends on nanotube 411, nanotube 411 may be written as it is being read (i.e. simultaneous read/write operation). For example, NEM memory cell 400 may be constructed such that charge members 402 and 403 are coupled together. For example, contact 405 may be used to sense a charge in nanotube 411. Contact 406 may than be used to write a charge to nanotube 411. In preferred embodiments, the amount of charge applied to contact 406 may be proportional to the amount of charge applied to charge members 402 and 403. As a result, multiple states may be simultaneously written and read into nanotube 411. Yet, it may be necessary to uncouple the "reading" end of NEM memory cell 400 before the "writing" end of NEM memory cell 400 is uncoupled in order to ensure that a charge is adequately stored on nanotube 411. Thus, depending on the application, charge members 402 and 403 may be independent and electrically isolated from one another. NEM memory cell 400 may also be simultaneously written and re-written to by contact 432.

A NEM memory cell may also be embodied with a nanotube having only a single free-moving end. More particularly, nanotube 411 may also be attached at one end to base member 404 via isolation layer 401 such that, for example, only charge member 402 and contact 405 are needed. This example would provide a MEM memory cell 400 that is similar to the structure illustrated in FIG. 4 to the left of line 451. Contact 405 would preferably be utilized as both a sensing and writing contact. However, contact 432 may still be utilized to write or re-write nanotube 411.

As an alternative to memory cells, the principles of the present invention may be utilized to construct memory components (e.g., memory latches) from nanotube-based inverters.

Figure 5:
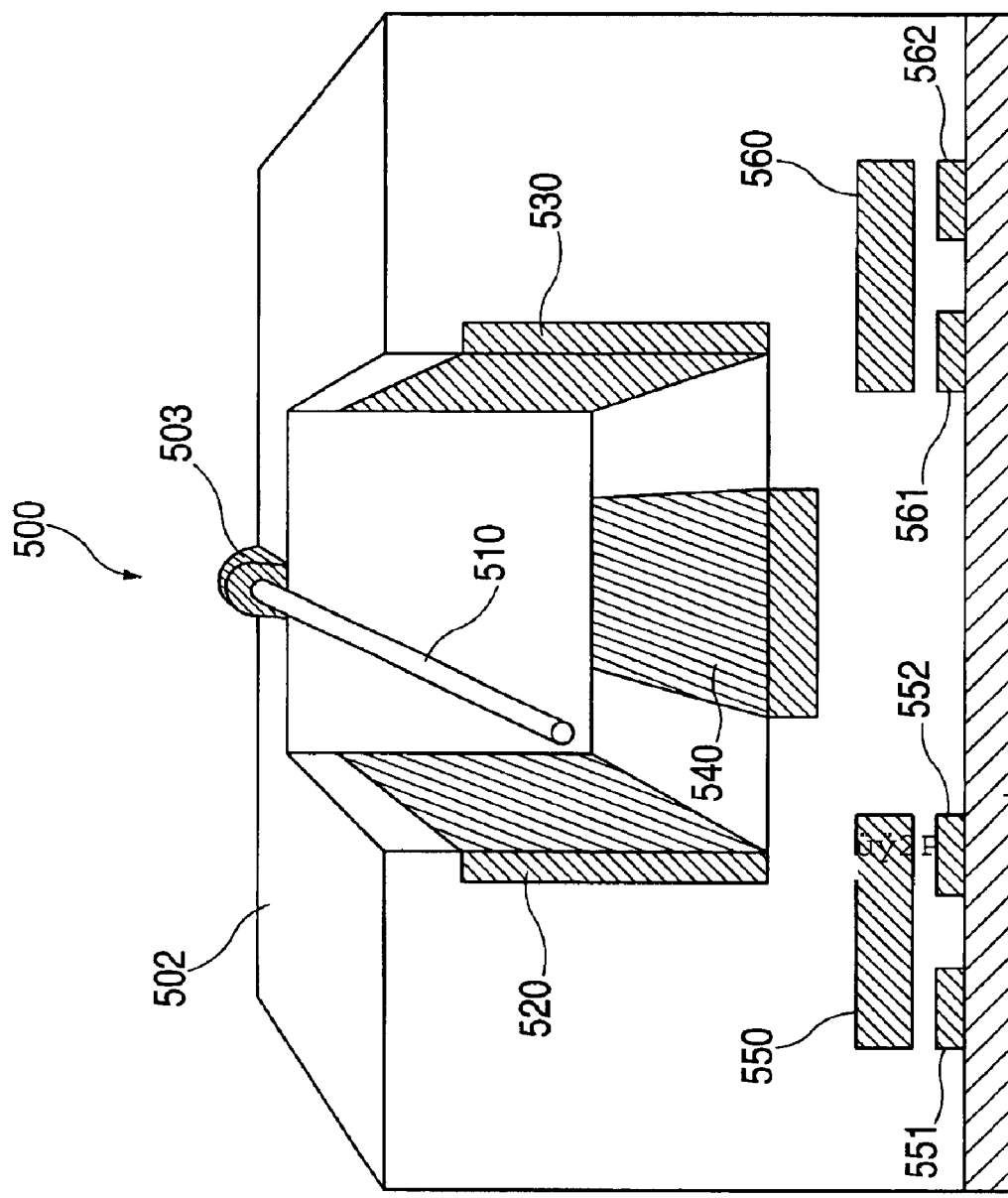
FIG. 5 is a three-dimensional perspective view of another nanometer-scale electromechanical memory cell constructed in accordance with the principle of the present invention.

FIG. 5 shows memory cell 500 that includes three sense contacts 520, 530, and 540 and two charge containment layers 550 and 560. A single nanotube 510 is utilized to read both charge containment layers 550 and 560. As a result, memory cell 500 may actually be seen as providing the functionality of two memory cells while only including a single nanotube 510.

Figure 6:
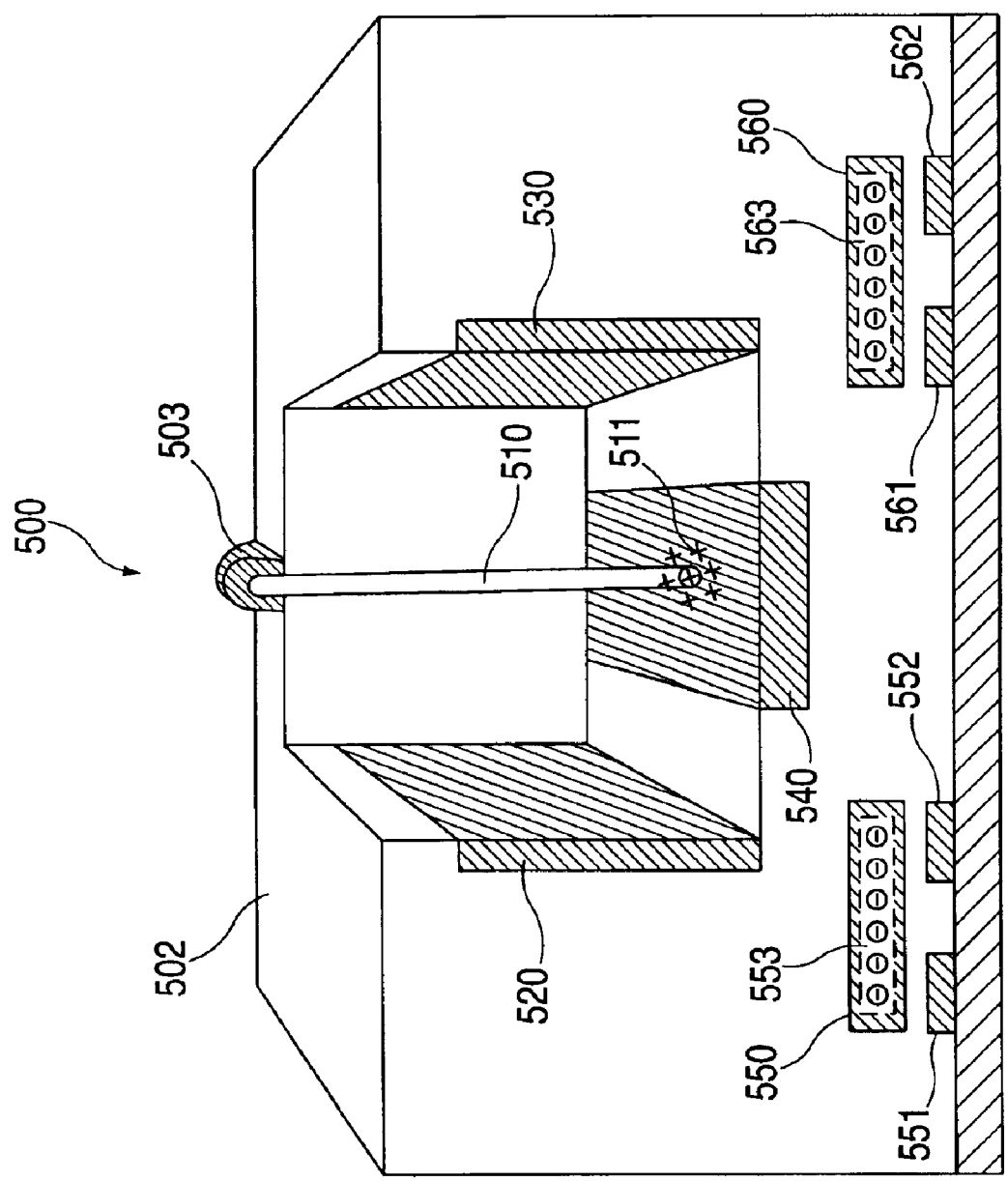
FIGS. 6–8 are three-dimensional perspective views of the functionality of one embodiment of the memory cell from FIG. 5 constructed in accordance with the principles of the present invention.
Figure 7:
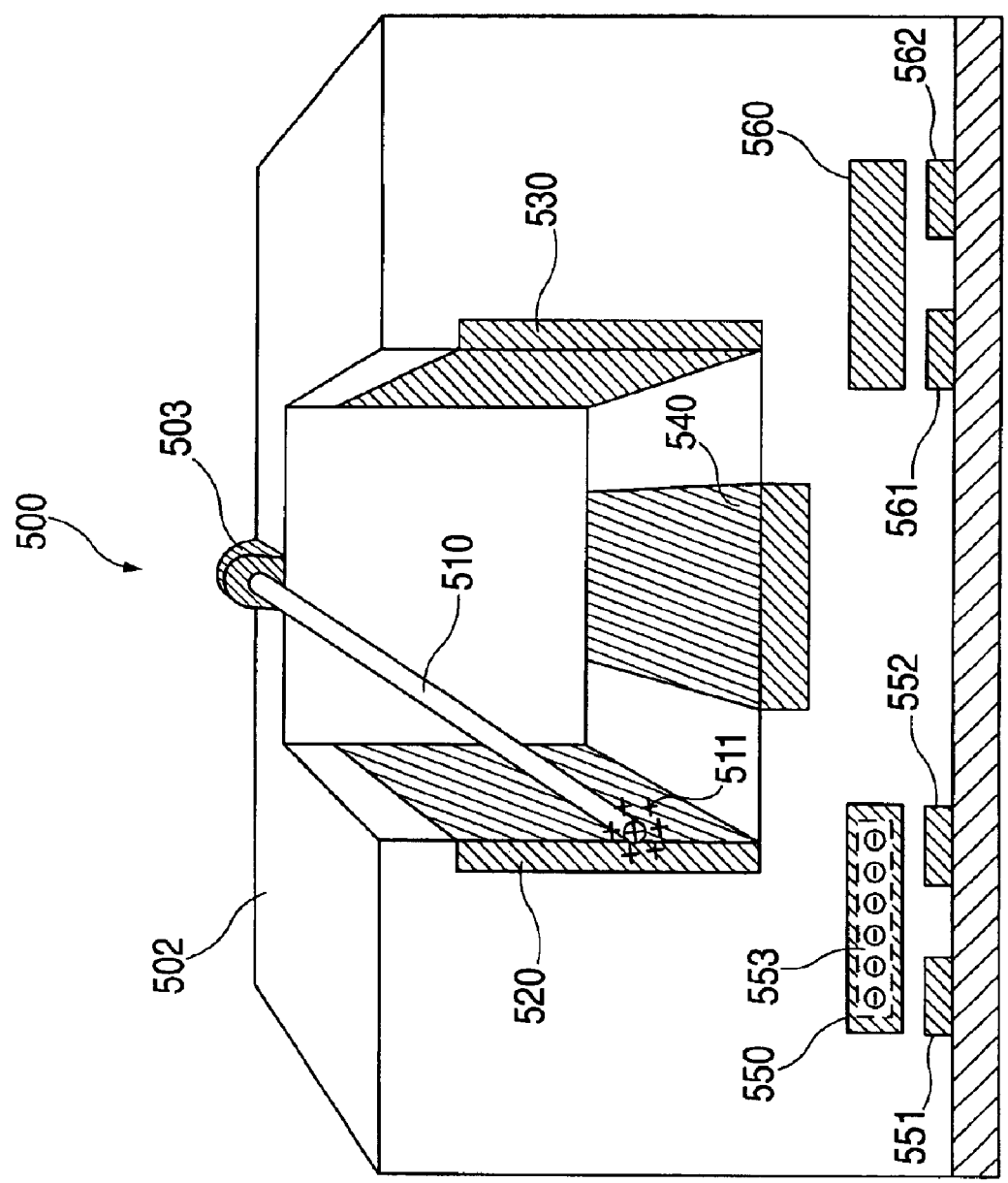
Figure 8:
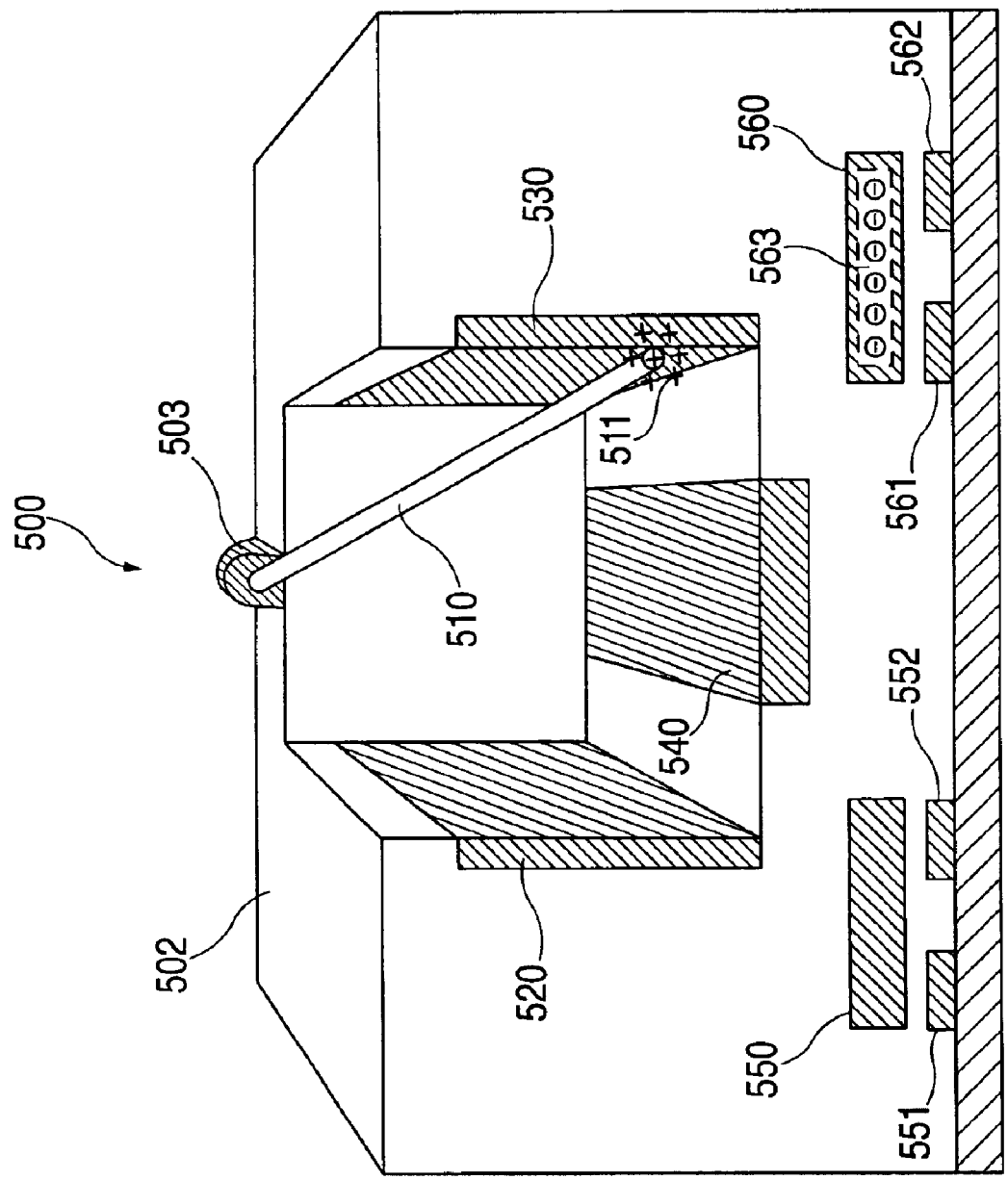

Charge containment layer 550 may be written to, or erased by, contacts 551 and 552. Similarly, charge containment layer 560 may be written to, or erased by, contacts 561 and 562. Nanotube 510 is anchored to base 502 by conductive retainer 503. Non-conductive layer 502 is utilized as a memory cell sculpting and component isolating layer. FIG. 5 shows an example of how memory cell 500 may operate when no net charges exist in either charge containment layers 550 or 560. In this embodiment, nanotube 510 is in a resting location and is isolated from sense contacts 520, 530, and 540. If a charge is applied to nanotube 510 then nanotube 510 will generally not be substantially dislocated because neither a repelling force or an attracting force will be provided by charge containment layers 550 and 560. FIGS. 6–8 show some of the various instances when charge containment layers 550 and 560 provide displacement in the location of nanotube 510.

FIG. 6 shows memory cell 500 when a net negative charge is stored in both charge containment layers 550 and 560 and a net-positive charge 511 is applied to nanotube 510 via conducting retainer 503. In particular, negative charge profiles 553 and 563 preferably generate a downward motion that causes nanotube 510 to electrically couple to sense contact 540, thus providing a signal, representative of charge containment layers 550 and 560 having stored charges, to control circuitry (not shown). Each of sense contacts 520, 540, and 530 (or the signals associated with nanotube coupling to sense contacts 520, 540, and 540) may be mapped to a state of information. Thus, memory cell 500 may store two-bits (four states) of information. A magnetic field may also be either permanently imposed on memory cell 500 or selectively imposed on memory cell 500 according to the signals applied to conductive retainer 503.

FIG. 6 shows memory cell 500 when charge profile 553 and charge profile 563 is stored in charge containment layers 550 and 560, respectively. In this instance, if an opposite polarity of charge is provided at the end of nanotube 510, an attracting force preferably causes nanotube 510 to couple sense contact 540.

FIG. 7 shows memory cell 500 when only charge profile 553 is provided by charge containment layer 550. In this instance, if an opposite polarity of charge is provided at the end of nanotube 510, an attracting force preferably causes nanotube 510 to couple sense contact 520.

FIG. 8 shows memory cell 500 when only charge profile 563 is provided by charge containment layer 560. In this instance, if an opposite polarity of charge is provided at the end of nanotube 510, an attracting force preferably causes nanotube 510 to couple sense contact 530.

Persons skilled in the art will appreciate that additional sense contacts and charge containment layers may be included in memory cell 500. Furthermore, memory cell 500 is not just limited to using the polarities illustrated. Memory cell 500 may easily utilize the opposite polarities or a combination thereof. For example charge containment layer 560 may store a positive charge profile while charge containment layer 553 stores a negative charge profile.

Figure 9:
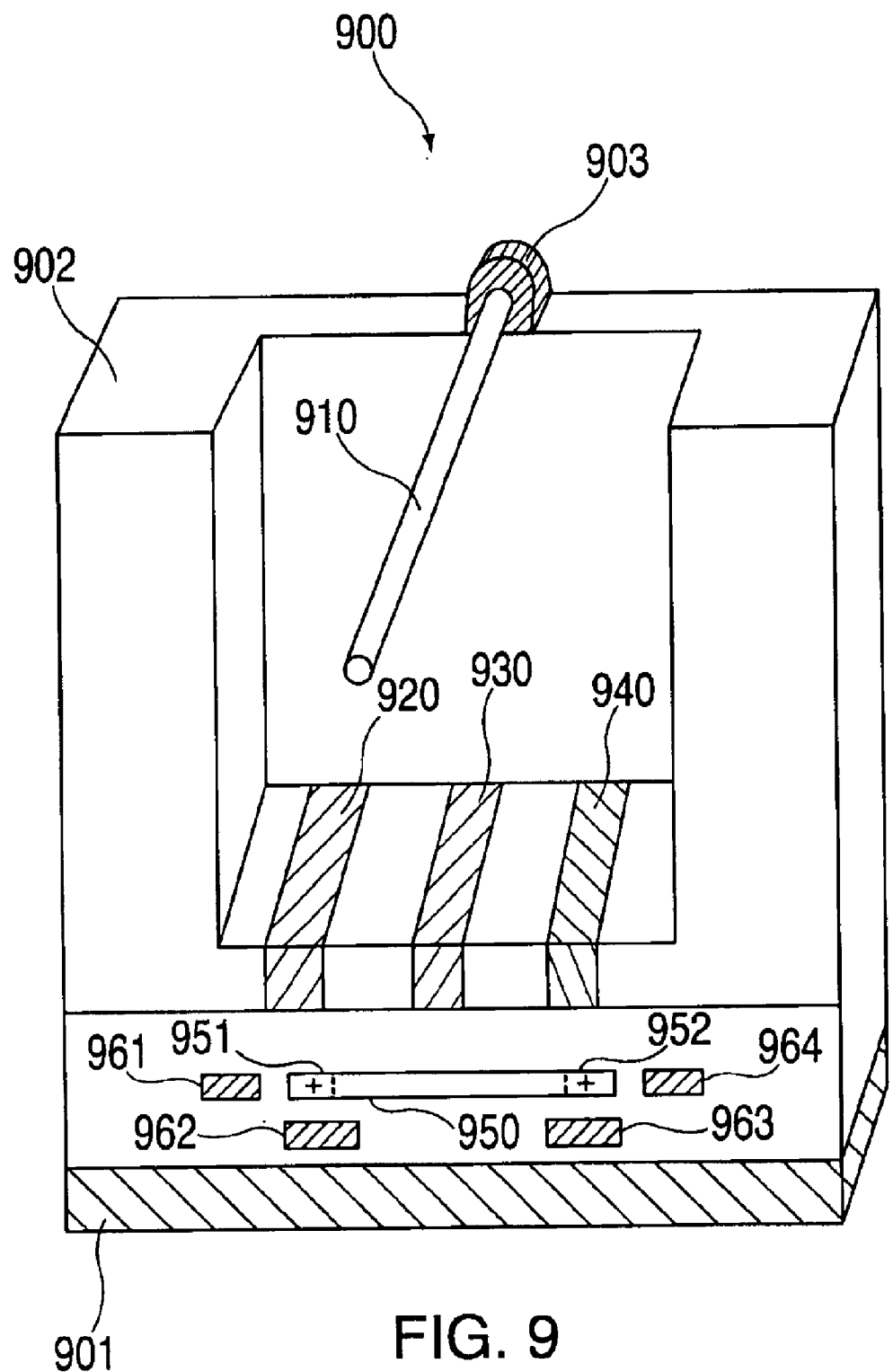
FIG. 9 is a three-dimensional perspective view of another nanometer-scale electromechanical memory cell constructed in accordance with the principles of the present invention.

FIG. 9 shows memory cell 900 in which a single charge containment layer 950 is included that can hold multiple charge profiles 951 and 952. In the illustrated embodiment, two charge profiles are included. However, numerous additional charge profiles may be included in charge containment layer 950. Charge containment layer 950 stores multiple and distinct bits. Charge containment layer 950 may be, for example, an oxide-nitride-oxide layer.

Charge profiles 951 and 952 may be erased and written to by contacts 961–964. Persons skilled in the art will appreciate that contacts 961 and 964 may be removed from memory cell 900 without detracting from its operability. Alternatively, additional contacts may be placed around charge containment layer 950 to, for example, store additional bits, erase faster, erase more accurately, write faster, and write more accurately.

Preferably, memory cell 900 operates as follows. Sense contact 920 will receive a signal if only charge profile 951 is present and a charge of an opposite polarity is applied to nanotube 910. Sense contact 930 will receive a signal if both charge profiles 951 and 952 are present and a charge of an opposite polarity is applied to nanotube 910. Sense contact 940 will receive a signal if only charge profile 952 is present and a charge of an opposite polarity is applied to nanotube 910. None of the sense contacts 920, 930, and 940 will receive a signal if neither charge profile 951 nor 952 are present. Thus, four states may be determined from the two bits stored in charge containment layer 950. If a base-four logic system is utilized then a single base-four bit may be read from memory cell 900. Sense contacts 920, 930, and 940 may, for example, be placed above nanotube 910 such that repelling forces from charge profiles 951 and 952 create electrical couplings between nanotube 910 and these sense contacts if the polarity of the charge applied to nanotube 910 is the same as the charges stored in charge containment layer 950.

Figure 10:
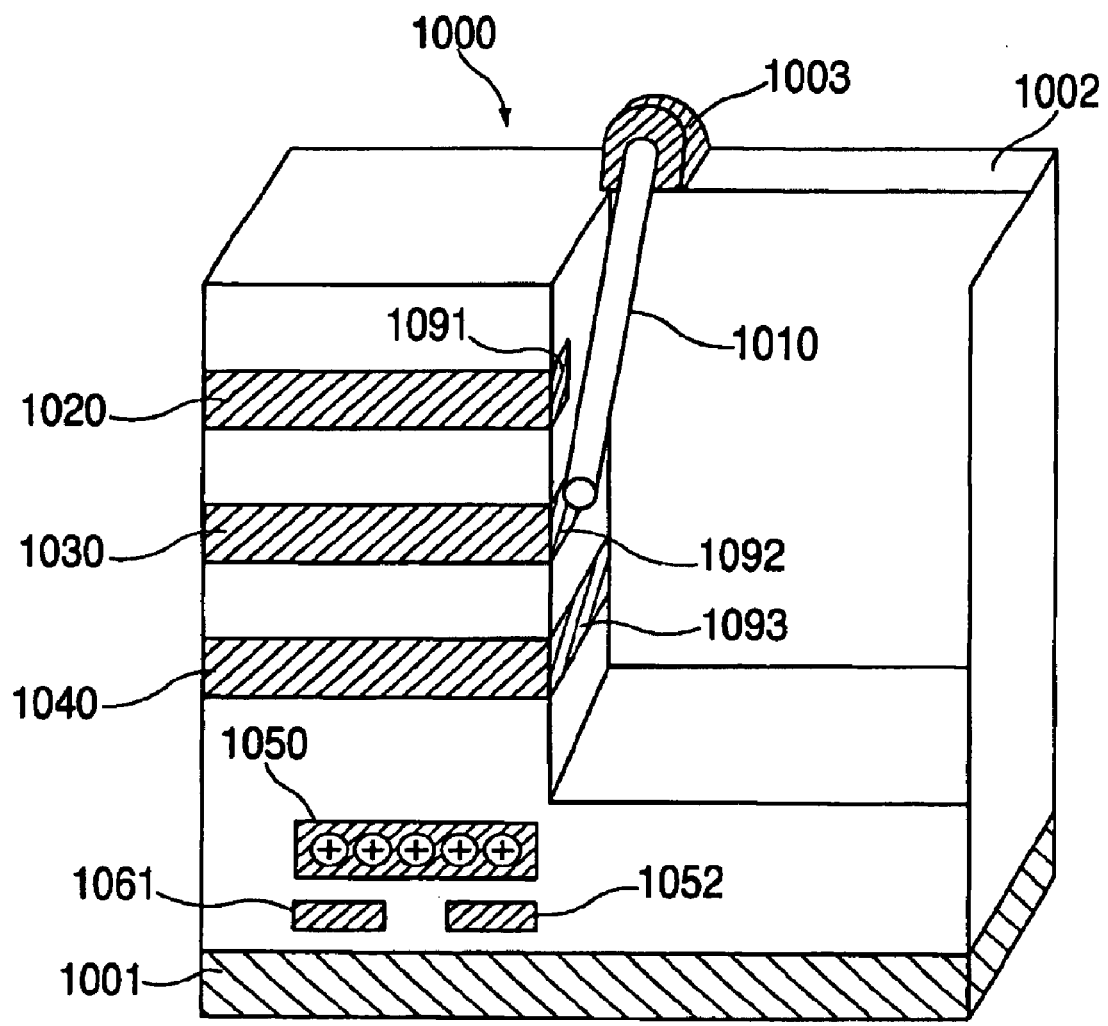
FIG. 10 is a three-dimensional perspective view of yet another nanometer-scale electromechanical memory cell constructed in accordance with the principles of the present invention.

FIG. 10 shows memory cell 1000 in which a single single-bit memory cell 1050 is included and written to, and erased by, signals applied to contacts 1051 and 1052. Memory cell 1000 includes nanotube 1010 that is coupled to conductive retainer 1003 and anchored to base 1001 by non-conductive layer 1002. Sense contacts 1020, 1030, and 1040 are also included.

Memory cell 1000 illustrates the principle that multiple states can be determined from a single charge profile. For example, a SMALL, MEDIUM, and LARGE charge may be stored in charge containment layer 1050. If a SMALL charge is stored, an appropriate signal is applied to nanotube 1010 then nanotube 1010 preferably electrically couples sense contact 1020. If a MEDIUM charge is stored, an appropriate signal is applied to nanotube 1010 then nanotube 1010 preferably electrically couples sense contact 1030. If a LARGE charge is stored, an appropriate signal is applied to nanotube 1010 then nanotube 1010 preferably electrically couples sense contact 1040. A fourth state can be determined if a signal is applied to nanotube 1010 and none of sense contacts 1020, 1030, and 1040 pick up a signal from nanotube 1010.

Persons skilled in the art will appreciate that conductive sense contacts 1020, 1030, and 1040, may have different dimensions 1091, 1092, and 1093 such that nanotube 1010 only couples a single sense contact at any one time. Alternatively, sense contacts 1020, 1030, and 1040 may have the same dimensions. In such an embodiment control circuitry (not shown) simply has to determine, for example, which sense contact closest to (or furthest from) charge containment layer 1050 is receiving a signal representative of a signal applied to nanotube 1010 in order to determine the amount of charge that is stored (or is not stored) in containment layer 1050.

Figure 10A:
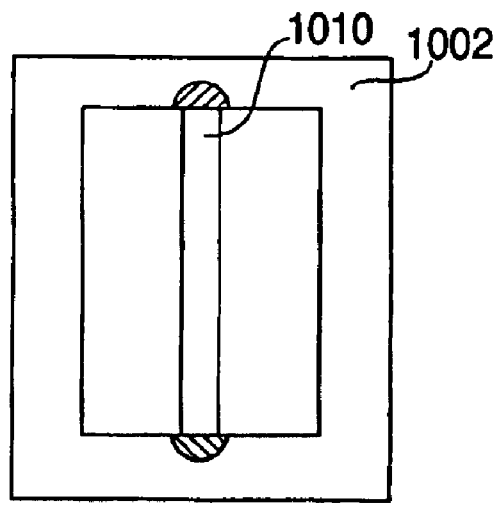
FIG. 10A is a top-down view of yet another nanometer-scale electromechanical memory cell constructed in accordance with the principles of the present invention.

Persons skilled in the art will appreciate that each of contacts 1020, 1030, and 1040 may be either nanometer-scale beams (e.g., nanotubes) themselves or coupled to nanometer-scale beams (e.g., nanotubes) such that nanotube 1010 electrically couples with these nanometer-scale beams instead of contacts 1020, 1030, and 1040. As a result, wear in system 1000 will be minimized since certain nanometer-scale beams exhibit good (e.g., LOW) wear characteristics. Additionally, nanotube 1010 may be attached at both ends to layer 1002 (i.e., mounted to base 1001), as shown in FIG. 10A. In such an embodiment, the portion between these two mounted ends is free to move. Mounting nanotube 1010 at both ends increases stability in system 1000 and, as a result, increases the level of control of nanotube 1010. Persons skilled in the art will appreciate that dimensions 1091, 1092, and 1093 will preferably form a pyramid shape if nanotube 1010 is attached at both ends.

Persons skilled in the art will appreciate that two components do not have to be connected or coupled together in order for these two components to electrically interact with each other. Thus, persons skilled in the art will appreciate that two components are electrically coupled together, at least for the sake of the present application, when one component electrically affects the other component. Electrical coupling may include, for example, physical connection or coupling between two components such that one component electrically affects the other, capacitive coupling, electromagnetic coupling, free charge flow between two conductors separated by a gap (e.g., vacuum tubes), and inductive coupling.

Additional advantageous nanometer-scale electromechanical assemblies are described in commonly assigned copending U.S. patent application Ser. No. 10/453,326 to Pinkerton et. al entitled "Electromechanical Assemblies Using Molecular-Scale Electrically Conductive and Mechanically Flexible Beams and Methods For Application of Same," commonly assigned copending U.S. patent application Ser. No. 10/453,783 to Pinkerton et. al, entitled "Nanoelectromechanical Transistors and Switch Systems," and commonly assigned copending U.S. patent application Ser. No. 10/453,373 to Pinkerton et. al entitled "Energy Conversion Systems Utilizing Parallel Array of Automatic Switches and Generators," which are all hereby incorporated by reference in their entirely and filed on the same day herewith.

From the foregoing description, persons skilled in the art will recognize that this invention provides nanometer-scale electromechanical memory cells and methods for using the same. Persons skilled in the art will appreciate that the various configurations described herein may be combined without departing from the present invention. For example, a magnetic field may be included in the nanometer-scale memory cell 1000 of FIG. 10. It will also be recognized that the invention may take many forms other than those disclosed in this specification. Accordingly, it is emphasized that the invention is not limited to the disclosed methods, systems and apparatuses, but is intended to include variations to and modifications therefrom which are within the spirit of the following claims.

What is claimed is:

1. A nanometer-scale memory cell comprising:
   a base;
   a mounting assembly attached to said base;
   a nanometer-scale beam fixed to said mounting assembly and having a first portion that is free-to-move; and
   a first charge containment layer isolated by non-conductive layers and coupled to said base in the proximity of said first free-moving portion, being able to store a first charge profile in said first charge containment layer without moving said nanometer-scale beam.

2. The memory cell of claim 1, wherein said nanometer-scale beam is a nanotube.

3. The memory cell of claim 1, wherein said nanometer-scale beam is a single walled carbon nanotube, a multi-walled carbon nanotube, a boron carbide nanotube, or a carbon nitride nanotube.

4. The memory cell of claim 1, wherein said nanometer-scale beam is a tube-shaped, electrically conductive and mechanically flexible, molecule.

5. The memory cell of claim 1, wherein said nanometer-scale beam is a rod-shaped, electrically conductive and mechanically flexible, molecule.

6. The memory cell of claim 1, wherein said nanometer-scale beam is a group of bonded, electrically conductive and mechanically flexible, molecules.

7. The memory cell of claim 1, further comprising:
   a first sense contact placed in the proximity of said first free-moving portion.

8. The memory cell of claim 1 wherein said charge profile is stored in said first charge containment layer.

9. The memory cell of claim 1, further comprising:
   a first transistor having an emitter, base, and collector terminal, wherein said emitter terminal is coupled to said charge containment layer;
   a control circuit coupled to said base terminal; and
   a first WRITE/ERASE contact coupled to said collector terminal.

10. The memory cell of claim 1, further comprising:
    a transistor having an emitter, base, and collector terminal, wherein said collector terminal is coupled to said charge containment layer;
    a control circuit coupled to said base terminal; and
    a first WRITE/ERASE contact coupled to said emitter terminal.

11. The memory cell of claim 1 wherein said mounting assembly further comprises:
    a conductive layer coupled to said nanometer-scale beam.

12. The memory cell of claim 11, wherein said mounting assembly further comprises:
    an isolation layer coupled between said conductive layer and said base.

13. The memory cell of claim 1, wherein said nanometer-scale beam is fixed at one end.

14. The memory cell of claim 1, wherein said nanometer-scale beam is fixed at both ends.

15. The memory cell of claim 1, wherein said nanometer-scale beam comprises a second portion that is free-to-move, said nanometer-scale beam fixed to said mounting assembly between said first and second free-moving portions.

16. The memory cell of claim 1, further comprising:
    a TEST contact placed in the proximity of a resting location of said first free-moving portion; and
    a sense circuit coupled to said TEST contact that senses when said first free-moving portion is in said resting location.

17. The memory cell of claim 1, further comprising:
    a voltage source coupled to said nanometer-scale beam, wherein said charge profile having a first polarity, said voltage source having a second polarity, and said charge profile is stored in said first charge containment layer;
    a first sense contact placed in the proximity of said first free-moving portion; and
    a sense circuit that senses when said first free-moving portion electrically couples said first sense contact.

18. The memory cell of claim 17, wherein said first and second polarities are of opposite polarities.

19. The memory cell of claim 17 wherein said first and second polarities are of the same polarity.

20. The memory cell of claim 17, further comprising:
a second charge containment layer in the proximity of said first free-moving portion being able to store a second charge profile.

21. The memory cell of claim 17, further comprising:
a second sense contact placed in the proximity of said first free-moving portion.

22. The memory cell of claim 21, wherein said free-moving portion electrically couples to said first sense contact when said first charge profile comprises a first amount of charge and said free-moving portion electrically couples to said second contact when said first charge profile has a second amount of charge, wherein said first amount of charge is not equivalent to said second amount of charge.

23. The memory cell of claim 1, further comprising:
a second charge containment layer placed in the proximity of said first free-moving portion being able to store a second charge profile.

24. The memory cell of claim 1 further comprising:
a first sense contact; and
a sense circuit that senses the rate of contact between said first free-moving portion and said first sense contact for a period of time.

25. The memory cell of claim 24 wherein said first charge profile is stored in said first charge containment layer, said first charge profile comprising a first amount of charge that causes said first-free moving portion to contact said first sense contact at a first contact rate.

26. The memory cell of claim 25 further comprising:
a control circuit, wherein said control circuit changes said first amount of charge to a second amount of charge and said first free-moving portion contacts said first sense contact at a second contact rate, said second contact rate being different from said first contact rate.

27. A nanometer-scale memory cell comprising:
a base;
a mounting assembly attached to said base;
a nanometer-Scale beam fixed to said mounting assembly and having a first portion that is free-to-move;
a first charge containment layer coupled to said base in the proximity of said first free-moving portion, said charge containment layer being able to store a first charge profile; and
a first sense contact placed in the proximity of said first free-moving portion and exposed to a magnetic field.

28. A nanometer-scale memory cell comprising:
a base;
a mounting assembly attached to said base;
a nanometer-scale beam fixed to said mounting assembly and having a first portion that is free-to-move;
a first charge containment layer coupled to said base in the proximity of said first free-moving portion, said charge containment layer being able to store a first charge profile; and
an isolation layer;
a first WRITE/ERASE contact placed between said isolation layer and said charge containment layer; and
WRITE/ERASE electrical signals that are provided to said WRITE/ERASE contact, wherein said WRITE/ERASE electrical signals write said first charge profile into said charge containment layer.

29. The memory cell of claim 28 further comprising a control circuit that provides said WRITE/ERASE electrical signals.

30. A nanometer-scale memory cell comprising:
a base;
a mounting assembly attached to said base;
a nanometer-scale beam fixed to said mounting assembly and having a first portion that is free-to-move;
a first charge containment layer coupled to said base in the proximity of said first free-moving portion, said charge containment layer being able to store a first charge profile, wherein said charge profile is stored in said first charge containment layer; and
an isolation layer;
a first WRITE/ERASE contact placed between said isolation layer and said charge containment layer; and
WRITE/ERASE electrical signals that are provided to said WRITE/ERASE contact, wherein said WRITE/ERASE electrical signals erase said charge profile from said first charge containment layer.

31. The memory cell of claim 30 further comprising a control circuit that provides said WRITE/ERASE electrical signals.

32. A nanometer-scale memory cell comprising:
a base;
a mounting assembly attached to said base;
a nanometer-scale beam fixed to said mounting assembly and having a first portion that is free-to-move;
a first charge containment layer coupled to said base in the proximity of said first free-moving portion, said charge containment layer being able to store a first charge profile;
a first transistor having an emitter, base, and collector terminal, wherein said emitter terminal is coupled to said charge containment layer;
a control circuit coupled to said base terminal; and
a first WRITE/ERASE contact coupled to said collector terminal, wherein said transistor comprises a nanometer-scale transistor.

33. A nanometer-scale memory cell comprising:
a base;
a mounting assembly attached to said base;
a nanometer-scale beam fixed to said mounting assembly and having a first portion that is free-to-move;
a first charge containment layer coupled to said base in the proximity of said first free-moving portion, said charge containment layer being able to store a first charge profile;
a transistor having an emitter, base, and collector terminal, wherein said collector terminal is coupled to said charge containment layer;
a control circuit coupled to said base terminal; and
a first WRITE/ERASE contact coupled to said emitter terminal, wherein said transistor comprises a nanometer-scale transistor.

34. A method for using a nanoelectromechanical memory cell comprising:
storing a charge profile in a charge containment layer, isolated by non-conductive layers and coupled to a base in the proximity of a first portion of a nanometer-scale beam that is free-to-move, without moving said nanometer-scale beam, wherein a second portion of said nanometer-scale beam is coupled to a mounting assembly, wherein said mounting assembly is coupled to the base.

35. The method of claim 34 wherein said storing is provided by at least one WRITE contact separated from said charge containment layers by an isolation layer.

36. The method of claim 34 further comprising:
erasing said charge profile from said charge containment layer.

37. The method of claim 36 wherein said erasing is provided by at least one ERASE contact separated from said charge containment layer by an isolation layer.

38. The method of claim 34, further comprising:
reading said charge profile from said charge containment layer.

39. The method of claim 38 wherein said reading is provided by a SENSE contact placed in the proximity of said first portion.

40. The method of claim 38, further comprising:
applying a voltage to said nanometer-scale beam.

41. The method of claim 40 wherein said reading is provided by a SENSE contact that electrically couples with said first portion when said charge profile interacts with said voltage to displace said first portion toward said SENSE contact.

42. A nanometer-scale memory cell, said memory cell comprising:
a base;
a mounting assembly coupled to said base;
a nanometer-scale beam coupled to said mounting assembly and having a portion that is free-to-move;
a charge containment layer isolated by non-conductive layers and coupled to said base in the proximity of said free-moving portion being operable to store a charge profile; and
a first nanotube fixed to said base and located in the proximity of said free-moving portion such that said nanometer-scale beam electrically couples with said first nanotube when said charge profile is stored in said charge containment layer and said charge profile has a first amount of charge.

43. The nanometer-scale memory cell of claim 42 further comprising:
a second nanotube placed in the proximity of said free-moving portion such that said nanometer-scale beam electrically couples said second nanotube when said charge profile is stored in said charge containment layer and said charge profile has a second amount of charge.

44. A nanometer-scale memory cell, said memory cell comprising:
a base;
a mounting assembly coupled to said base;
a nanometer-scale beam coupled to said mounting assembly and having a portion that is free-to-move;
a charge containment layer isolated by non-conductive layers and in the proximity of said free-moving portion being able to store a charge profile in said charge containment layer without moving said nanometer-scale beam; and
a sense contact placed in the proximity of said free-moving portion such that said nanometer-scale beam contacts said sense contact at a first contact-rate when said charge profile is stored in said charge containment layer and at a second contact-rate when said charge profile is not stored in said charge containment layer, wherein said first and second contact-rates are not equivalent.

45. The nanometer-scale memory cell of claim 44 further comprising sense circuitry coupled to said sense contact that can distinguish between said first and second contact rates.

46. The nanometer-scale memory cell of claim 44 wherein said nanometer-scale beam comprises a nanotube.

* * * * *